(12) United States Patent
Fechner

(10) Patent No.: US 7,939,865 B2
(45) Date of Patent: May 10, 2011

(54) METAL SEMICONDUCTOR FIELD EFFECT TRANSISTOR (MESFET) SILICON-ON-INSULATOR STRUCTURE HAVING PARTIAL TRENCH SPACERS

(75) Inventor: Paul Fechner, Plymouth, MN (US)

(73) Assignee: Honeywell International Inc., Morristown, NJ (US)

( * ) Notice: Subject to any disclaimer, the term of this patent is extended or adjusted under 35 U.S.C. 154(b) by 48 days.

(21) Appl. No.: 12/357,794

(22) Filed: Jan. 22, 2009

(65) Prior Publication Data

US 2010/0181603 A1 Jul. 22, 2010

(51) Int. Cl.
*H01L 29/66* (2006.01)
(52) U.S. Cl. . 257/281; 438/167; 257/280; 257/E29.041; 257/E29.32
(58) Field of Classification Search ............... None
See application file for complete search history.

(56) References Cited

U.S. PATENT DOCUMENTS

| | | | |
|---|---|---|---|
| 3,651,384 A | 3/1972 | Waters et al. | |
| 4,482,907 A | 11/1984 | Jay | |
| 6,864,131 B2 * | 3/2005 | Thornton | 438/169 |
| 2001/0041395 A1 | 11/2001 | Ajmera et al. | |
| 2002/0115244 A1 | 8/2002 | Park et al. | |
| 2002/0153587 A1 | 10/2002 | Adkisson et al. | |
| 2003/0025157 A1 | 2/2003 | Ho et al. | |
| 2003/0052373 A1 | 3/2003 | Hayashi et al. | |
| 2003/0057459 A1 | 3/2003 | Rumennik | |
| 2003/0143785 A1 | 7/2003 | Kim et al. | |
| 2005/0173764 A1 | 8/2005 | Fechner | |
| 2006/0088963 A1 | 4/2006 | Ipposhi | |
| 2006/0270121 A1 | 11/2006 | Ipposhi et al. | |
| 2007/0257317 A1 | 11/2007 | Fechner et al. | |
| 2008/0224211 A1 | 9/2008 | He et al. | |
| 2008/0265312 A1 | 10/2008 | Bhalla et al. | |

FOREIGN PATENT DOCUMENTS

| | | |
|---|---|---|
| CN | 1610114 | 4/2005 |
| RU | 2229758 | 5/2004 |
| TW | 236137 | 7/2005 |

OTHER PUBLICATIONS

Ervin et al., "CMOS-Compatible SOI MESFETs with High Breakdown Voltage", "IEEE Transactions on Electron Devices", Dec. 2003, pp. 3129-3135, vol. 53, No. 12, Publisher: IEEE.

* cited by examiner

*Primary Examiner* — Jarrett J Stark
(74) *Attorney, Agent, or Firm* — Shumaker & Sieffert, P.A.

(57) ABSTRACT

In one embodiment, a metal-semiconductor field effect transistor (MESFET) comprises a first silicon layer, an insulator layer formed on the first silicon layer, and a second silicon layer formed on the insulator layer. A gate region, a source region, and a drain region are formed in the second silicon layer. A first partial trench is formed in the second silicon layer between at least a portion of the gate region and at least a portion of the source region, wherein the first partial trench stops short of the insulator layer. A second partial trench formed in the second silicon layer between at least a portion of the gate region and at least a portion of the drain region, wherein the second partial trench stops short of the insulator layer. First and second oxide spacers are formed in the first and second partial trenches. The first and second oxide spacers and the source region, gate region, and the drain region are substantially planar.

6 Claims, 5 Drawing Sheets

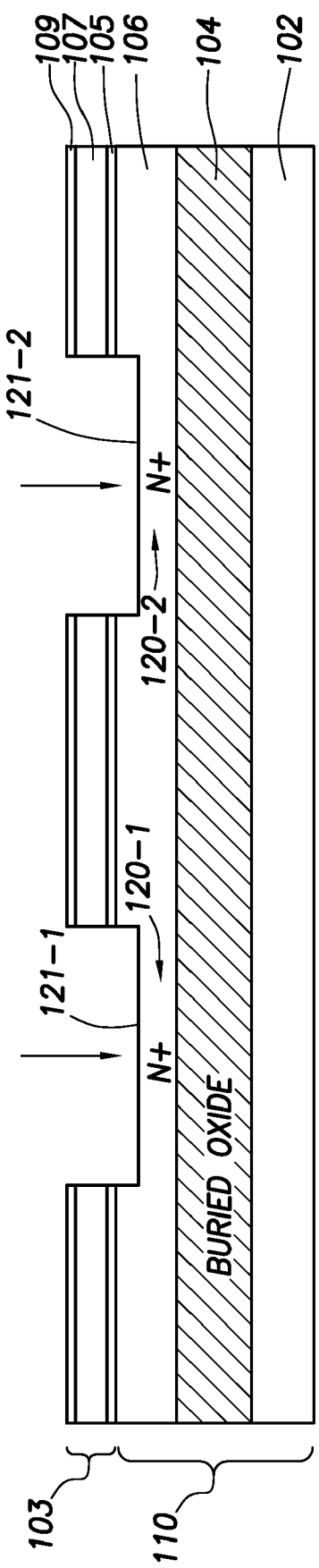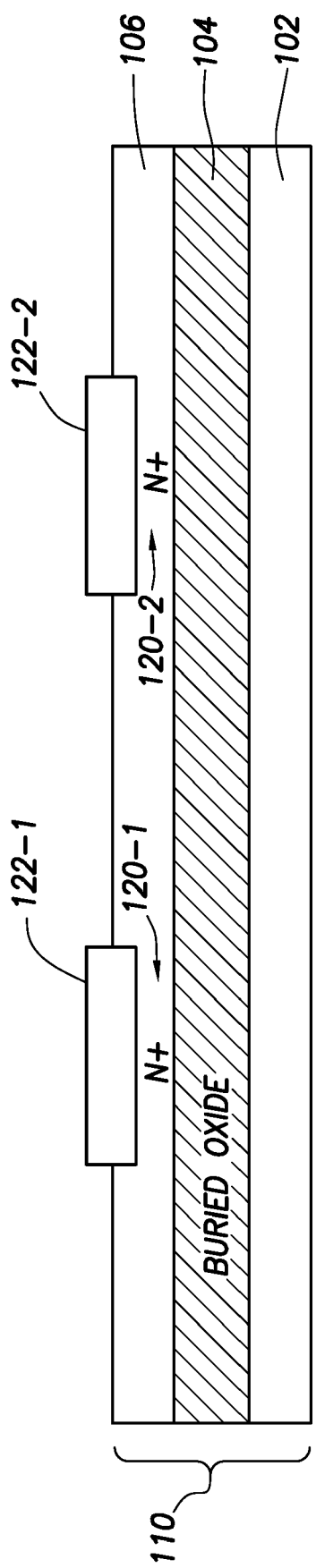

US 7,939,865 B2

METAL SEMICONDUCTOR FIELD EFFECT TRANSISTOR (MESFET) SILICON-ON-INSULATOR STRUCTURE HAVING PARTIAL TRENCH SPACERS

BACKGROUND

Field Effect Transistors (FETs) are transistors which rely on an electric field to control the shape, and hence the conductivity, of a channel of one type of charge carrier in a semiconductor material. FETs typically use a p-n junction for a gate. There are several different types of FETs, including Metal-Oxide Semiconductor Field Effect Transistors (MOSFETs) and Metal Semiconductor Field Effect Transistors (MESFETs).

MESFETs can be formed using Silicon on Insulator (SOI) technology. SOI technology uses layered silicon-insulator-silicon substrates in the manufacture of semiconductor devices. MESFETs typically use a Schottky junction for a gate as opposed to using a p-n junction as MOSFETs typically do. MESFETs can be made in which dopants are implanted into the device to achieve doping concentrations that enable complementary n- and p-channel Schotkky Junction Transistor (SJT) behavior. A Schottky junction (or barrier) is a potential barrier formed at a metal-semiconductor junction that has rectifying characteristics. A Schottky barrier typically has a lower junction voltage and a narrower depletion region than a p-n junction.

Each new complimentary metal-oxide-semiconductor (CMOS) process technology scales the MOSFET to smaller dimensions resulting in higher doping levels and lower operational voltages. However, a number of analog circuit applications still require the ability to support higher voltages. MESFETs capable of higher voltage operation than MOSFETs can be constructed on commercially available SOI CMOS without process modifications.

One approach to forming a MESFET using available SOI CMOS process technology is described in U.S. Pat. No. 6,864,131, filed on Mar. 17, 2003, entitled "Complementary Schottky Junction Transistors and Methods of Forming the Same" (the '131 Patent). Of particular note, with this approach, the silicide block step is used to separate the silicide that forms the Schottky gate from the silicide that forms the low-resistance contacts to the source and drain of the MESFET structure. However, such a silicide block step is generally used to form relatively large resistive components in either silicon or polysilicon and is typically a relatively low resolution step as compared to the rest of the SOI CMOS process flow. Since the respective spaces between the Schottky gate and the source and drains are key features in such a MESFET structure, the minimum size of the MESFET structure that is achievable using such an approach is typically constrained by the resolution of the silicide block step.

SUMMARY

In one embodiment, a metal-semiconductor field effect transistor (MESFET) comprises a first silicon layer, an insulator layer formed on the first silicon layer, and a second silicon layer formed on the insulator layer. A gate region, a source region, and a drain region are formed in the second silicon layer. A first partial trench is formed in the second silicon layer between at least a portion of the gate region and at least a portion of the source region, wherein the first partial trench stops short of the insulator layer. A second partial trench formed in the second silicon layer between at least a portion of the gate region and at least a portion of the drain region, wherein the second partial trench stops short of the insulator layer.

Another embodiment is directed to a method of forming a metal-semiconductor field effect transistor. The method comprises forming first and second partial trenches in a device silicon layer of a silicon on insulator (SOI) substrate, wherein the first and second partial trenches stop short of an insulator layer of the SOI substrate. The method further includes forming a source region, a drain region, and a gate region in the device silicon layer of the SOI substrate. The method further includes forming first and second insulating spacers in the first and second partial trenches, respectively. The first insulating spacer is formed between at least a portion of the gate region and at least a portion of the source region, and wherein the second insulating spacer is formed between at least a portion of the gate region and at least a portion of the drain region.

In another embodiment, a metal-semiconductor field effect transistor (MESFET) comprises a heavily doped source region in a device silicon layer, a heavily doped drain region in the device silicon layer, and a well region in the device silicon layer. The MESFET further comprises a gate region in the well region of the device silicon layer, a first oxide spacer that separates the source region from the gate region, and a second oxide spacer that separates the drain region from the gate region. The first and second oxide spacers and the source region, gate region, and the drain region are substantially planar.

The details of various embodiments of the claimed invention are set forth in the accompanying drawings and the description below. Other features and advantages will become apparent from the description, the drawings, and the claims.

DRAWINGS

FIGS. 3A-3F are a series of diagrams illustrating one example of the operation of the method of FIG. 2.

Like reference numbers and designations in the various drawings indicate like elements.

DETAILED DESCRIPTION

Figure 1A:
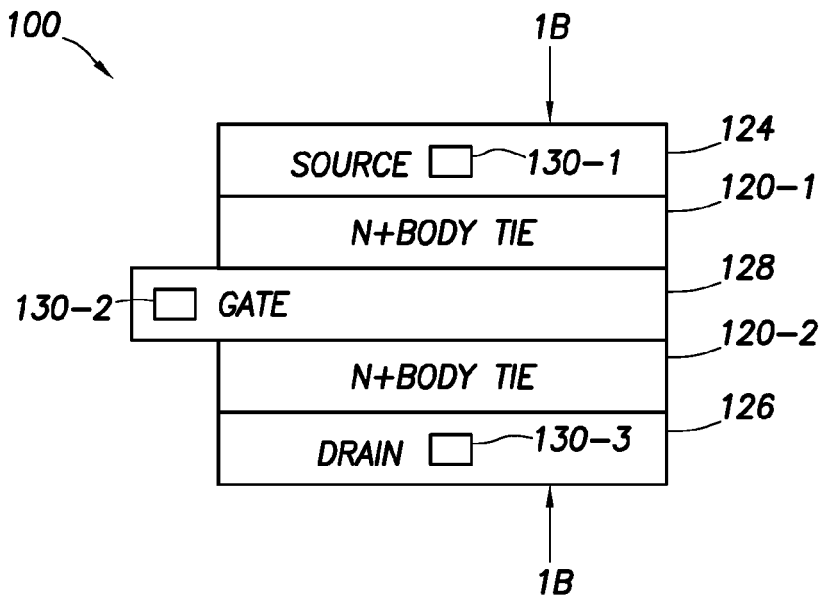
FIGS. 1A and 1B are various views of one embodiment of a Metal Semiconductor Field Effect Transistors (MESFET).
Figure 1B:
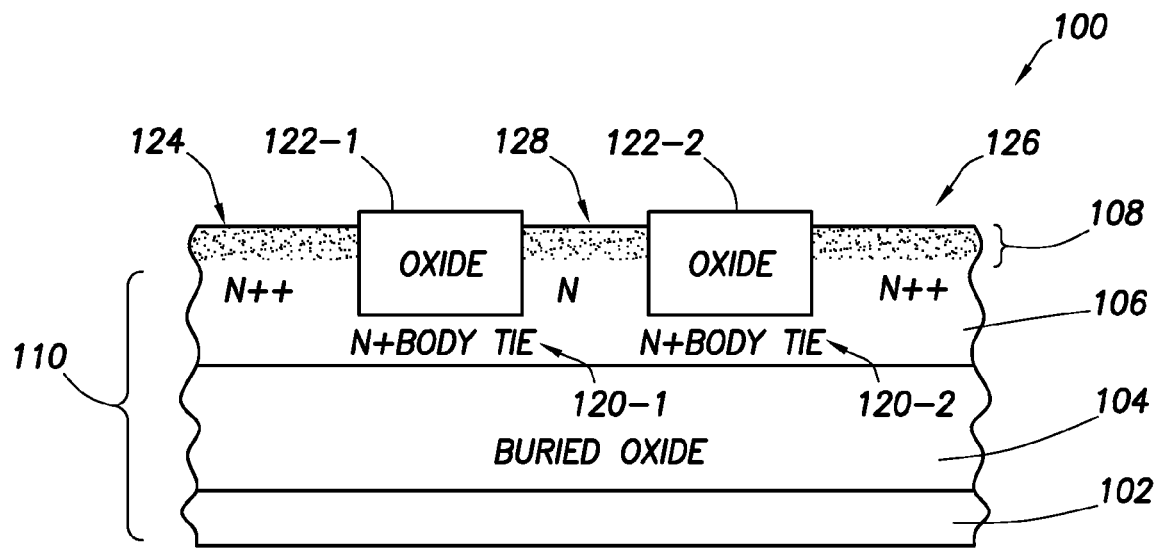

FIGS. 1A and 1B are various views of one embodiment of a Metal Semiconductor Field Effect Transistors (MESFET) 100. FIG. 1A shows a top view of the MESFET device 100. FIG. 1B is a cross-sectional view of the MESFET 100 taken along the line 1B-1B. The MESFET 100 is formed in a Silicon-on-Insulator (SOI) substrate 110. The SOI substrate 110 comprises a bulk silicon substrate 102 on which an insulating layer 104 is layered. In the embodiment described here in connection with FIGS. 1A and 1B, the insulating layer 104 is a silicon dioxide insulating layer and is also sometimes referred to here as "buried oxide layer" 104. A silicon device layer 106 is formed on top of the buried oxide layer 104.

The MESFET 100 includes a gate region 128, a source region 124, and a drain region 126 formed within the silicon device layer 106. A silicide layer 108 is formed on the top of the silicon device layer 106 in the source region 124, drain region 126, and gate region 128 by reacting suitable metal (such as titanium or cobalt) with the silicon device layer 106. The portion of the silicide layer 108 within the gate region 108 is used to form a Schottky gate above the lightly doped well region of the silicon device layer 106. The portions of the silicide layer 108 within the source and drain regions 124 and 126 are formed above the heavily doped regions of the silicon device layer 106.

The portion of the silicide layer 108 that is within the source region 124 is separated from the portion of the silicide layer 108 that is within the gate region 128 by a first partial trench 121-1 in which a first oxide spacer 122-1 is formed. The portion of the silicide layer 108 that is within the drain region 126 is separated from the portion of the silicide layer 108 that is within the gate region 128 by a second partial trench 121-2 in which a second oxide spacer 122-2 is formed. The partial trenches 121-1 and 121-2 are formed in the silicide layer 108 and the silicon device layer 106 and stop short of the insulting layer 104. The oxides spacers 122-1 and 122-2 are formed from an oxide, such as silicon dioxide $SiO_2$ and are formed using relatively high-resolution process steps that are used to pattern actives devices within the SOI substrate 110, which enables a reduction in the minimum source-gate separation length and drain-gate separation length over previous MESFET structures without otherwise having to modify the particular SOI process used to fabricate the MESFET 100. These reduced dimensions can result in major improvement in device frequency response for a given technology process without otherwise having to modify the particular SOI process used to fabricate the MESFET 100. The insulating spacers 122 and the source, drain, and gate portions of the silicide layer 108 are substantially planar, which leads to improved breakdown characteristics in the MESFET 100.

Body ties 120 (which are referred to here individually as body tie 120-1 and body tie 120-2) are located in the silicon device layer 106 below the partial trenches 121 and oxide spacers 120. The body ties 120 are doped to provide a conduction path from the well region within the gate region 128 to a body contact.

In the particular embodiment shown in FIGS. 1A and 1B, the MESFET 100 comprises an n-type MESFET structure, in which the well region formed below the Schottky gate in the silicon device layer 106 is a lightly doped n-type region, the heavily doped portions of the silicon device layer 106 within the source and drain regions 124 and 126 comprise heavily doped n-type (N++) regions, and the body ties 120 comprise n-type doped (N+) regions. In other embodiments, the MESFET comprises an p-type MESFET structure, in which the well region formed below the Schottky gate in the silicon device layer is a lightly doped p-type region, the heavily doped portions of the silicon device layer within the source and drain regions and comprise heavily doped p-type (P++) regions, and the body ties comprise p-type doped (P+) regions.

A thick oxide layer (not shown) is deposited over the MESFET structure, and openings in the thick oxide layer are provided through which conductive contacts 130-1, 130-2, and 130-3 are formed for the source region 124, drain region 126, and gate region 128, respectively. The conductive contacts are formed mainly out of metal.

Figure 2:
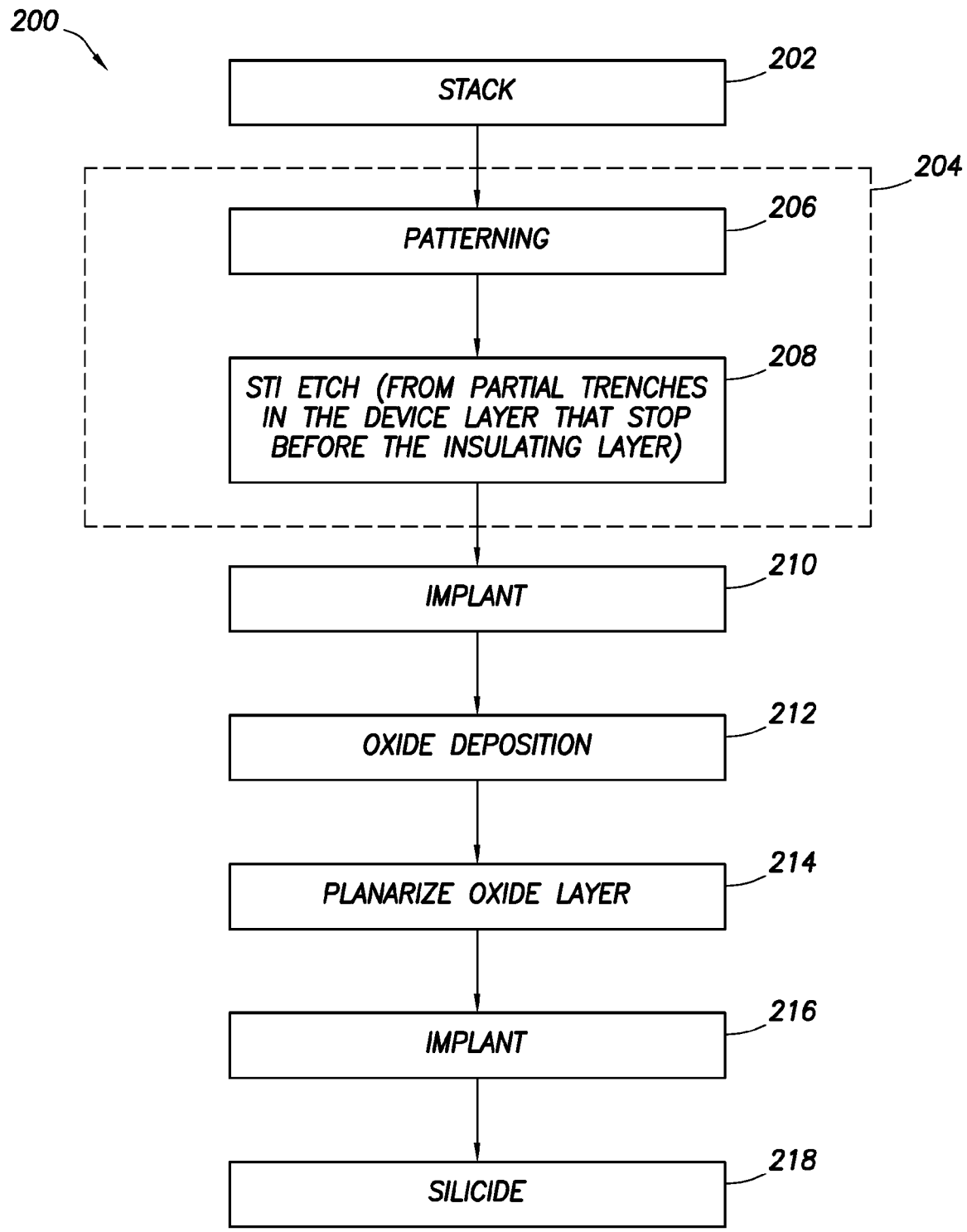
FIG. 2 is a flowchart of one embodiment of a method of forming a MESFET.

FIG. 2 is a flowchart of one embodiment of a method 200 of forming a MESFET 100. FIGS. 3A-3F are a series of diagrams illustrating one example of the operation of the method 200.

Figure 3A:
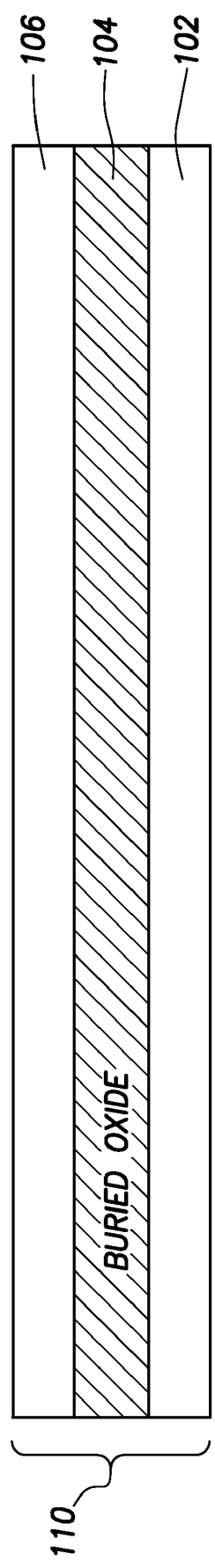

Method 200 begins with providing an SOI substrate 110 (block 202). One example of such an SOI substrate 110 is shown in FIG. 3A.

The SOI substrate 110 comprises a bulk silicon substrate 102 on which an insulating layer 104 is layered. A silicon device layer 106 is formed on top of the buried oxide layer 104. An oxide-nitride oxide layer 103 is formed on the SOI substrate (shown in FIG. 2), which is formed of three layers. A pad oxide layer 105 is deposited on the silicon device layer 106. A nitride layer 107 is deposited on the pad oxide layer 105. The pad oxide layer 105 allows the nitride layer 107 to be formed on the SOI substrate 110. A thin oxide layer 109 is deposited on the nitride layer 107.

Figure 3B:
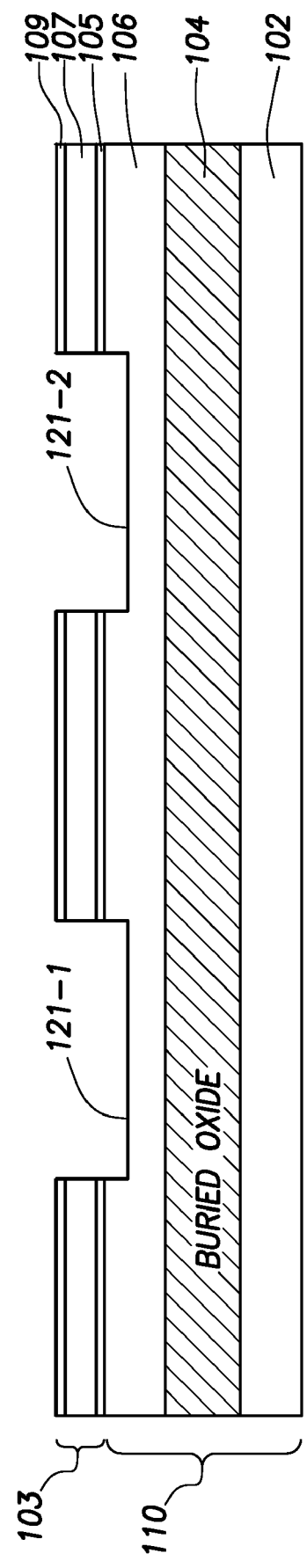

Method 200 includes forming the partial trenches 121-1 and 121-2 within the silicon device layer 106 (block 204 of FIG. 2). In the particular embodiment shown in FIG. 2, the partial trenches 121-1 and 121-2 are formed as follows. A photoresist mask is deposited onto the SOI substrate 110 and patterned and the oxide-nitride-oxide layers 103 are etched to form a "hard-mask" pattern for successive processes (block 206). This is a relatively high-resolution mask that is typically used to form active components within the silicon device layer 106. The hard-mask pattern includes features that define the partial trenches 121-1 and 121-2 (as well as any other needed features). Then, a "shallow trench" silicon etch is performed (block 208). The shallow trench silicon etch stops short of the buried oxide layer 104 and, thus, forms the partial trenches 121-1 and 121-2. Removing the photoresist mask prior to this shallow trench isolation etch is optional. The resulting partial trenches 121-1 and 121-2 are shown in FIG. 3B.

It is noted that other features of the MESFET structure 100 can be formed during these patterning and etch operations. For example, the additional feature of the body ties 120 can be at least partially formed during these operations. It is to be noted that additional etches can be performed (for example, including one or more shallow trench etches and one or more non-shallow trench etches) depending on the application and the other features that need to be formed.

Method 200 further includes an implant operation (block 210 of FIG. 2). An implant typically comprises a high-energy process that injects an ionized species such as boron, phosphorus, arsenic, or other ions into the silicon device layer 106. For example, ion implantation may be employed for the implant. Other doping methods that are compatible with the silicon device layer 106 may also be used. This implant operation is performed to dope the body ties 120 to provide a conduction path from the well region within the gate region 128 to a body contact. The oxide-nitride oxide layer 103 masks the silicon device layer 106 that has not been etched from the implant. FIG. 3C illustrates the implant operation. In the particular embodiment shown in FIGS. 3A-3F, the MESFET 100 includes n-type doped body ties 120. After the implant is performed, the photoresist mask may be removed and the wafer cleaned.

Method 200 further includes depositing an oxide (such as silicon dioxide $SiO_2$) (block 212 of FIG. 2). This oxide deposition operation is used to form the insulating spacers 122 within the partial trenches 121. FIG. 3D illustrates this operation.

Method 200 further includes planarizing the deposited oxide layer (block 214 of FIG. 2). For example, in one implementation of such an embodiment, chemical mechanical planarization (CMP) is performed (though other planarization techniques can also be employed). During the planarization process, the oxide-nitride oxide layer 103 is etched away. As result of this planarization operation, the insulating spacers 122 and the source, drain, and gate portions of the silicide layer 108 are substantially planar, which leads to improved breakdown characteristics in the MESFET 100.

Figure 3E:
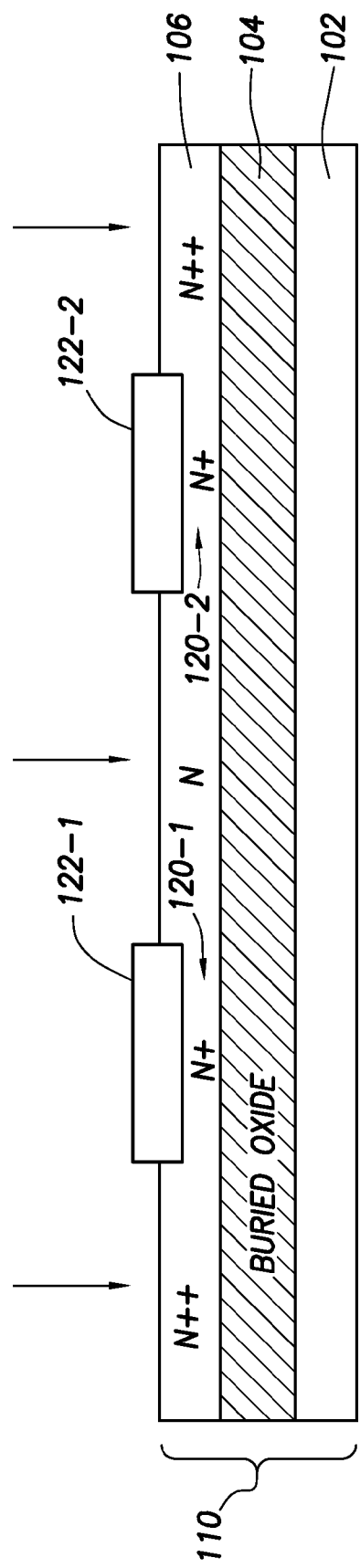

Method 200 further includes one or more additional implant operations (block 216 of FIG. 2). In one implementation of such an embodiment, a first implant operation is performed to create the lightly doped well region for the Schottky gate within the silicon device layer 106 and another implant operation is performed to create the heavily doped portions of the silicon device layer 106 within the source and drain regions 124 and 126. Suitable masking is used if necessary. FIG. 3E illustrates the results of these operations. In the particular embodiment shown in FIGS. 3A-3F, the MESFET 100 comprises an n-type MESFET structure, in which the well region formed below the Schottky gate in the silicon device layer 106 is a lightly doped n-type region and the heavily doped portions of the silicon device layer 106 within the source and drain regions 124 and 126 comprise heavily doped n-type (N++) regions. In other embodiments, the MESFET comprises a p-type MESFET structure, in which the well region formed below the Schottky gate in the silicon device layer is a lightly doped p-type region and the heavily doped portions of the silicon device layer within the source and drain regions and comprise heavily doped p-type (P++) regions.

Figure 3F:
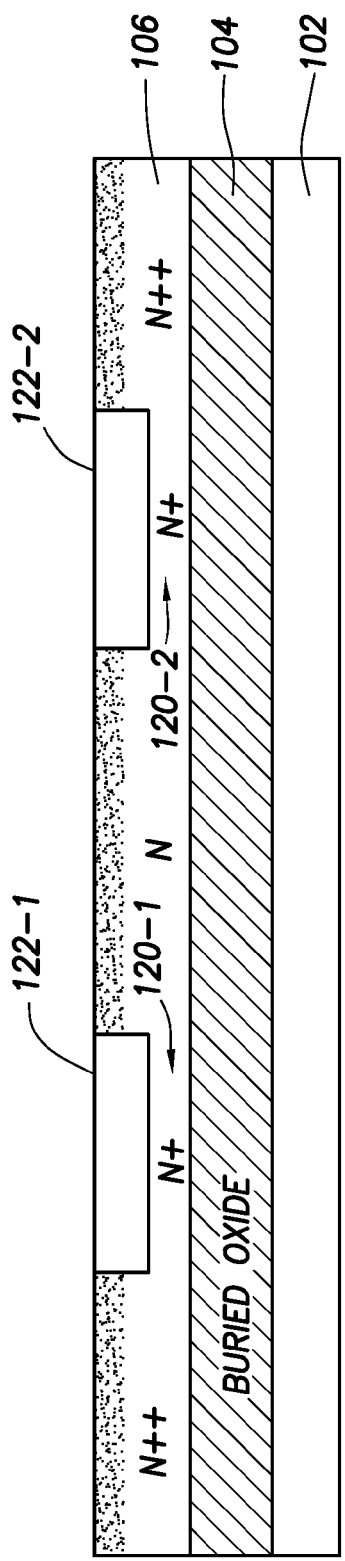

Method 200 further includes forming a silicide layer 108 on the top of the silicon device layer 106 (block 218). The result of this operation is illustrated in FIG. 3F. The silicide operation operation is performed by reacting suitable metal (such as titanium or cobalt) with the silicon device layer 106 within in the source region 124, drain region 126, and gate region 128. The portion of the silicide layer 108 within the gate region 108 is used to form a Schottky gate above the lightly doped well region of the silicon device layer 106. The portions of the silicide layer 108 within the source and drain regions 124 and 126 are formed above the heavily doped regions of the silicon device layer 106.

Additional operations (not shown in FIG. 2) are performed. For example, as noted above, a thick oxide layer (not shown) is deposited over the MESFET structure, and openings in the thick oxide layer are provided through which conductive contacts 130-1, 130-2, and 130-3 are formed for the source region 124, drain region 126, and gate region 128, respectively. The conductive contacts are formed mainly out of metal.

As noted above, the oxides spacers 122-1 and 122-2, which provide the gate-source and gate-drain separation, are formed using relatively high-resolution process operations that are used to form active devices within the SOI substrate 110, which enables a reduction in the minimum source-gate separation length and drain-gate separation length over previous MESFET structures without otherwise having to modify the particular SOI process used to fabricate the MESFET 100. These reduced dimensions can result in major improvement in device frequency response for a given technology process without otherwise having to modify the particular SOI process used to fabricate the MESFET 100. The insulating spacers 122 and the source, drain, and gate portions of the silicide layer 108 are also substantially planar, which leads to improved breakdown characteristics in the MESFET 100.

For example, one implementation of this embodiment employs 0.15 micrometer SOI CMOS process technology, a MESFET structure of at least a minimum gate length of 0.15 micrometer and at least a minimum channel access length of 0.24 micrometer can be achieved. This achieves a four-times reduction in minimum gate length over previous MESFETs without changing the process requirements.

A number of embodiments of the invention defined by the following claims have been described. Nevertheless, it will be understood that various modifications to the described embodiments may be made without departing from the spirit and scope of the claimed invention. Accordingly, other embodiments are within the scope of the following claims.

What is claimed is:

1. A metal-semiconductor field effect transistor (MESFET) comprising:
    a first silicon layer;
    an insulator layer formed on the first silicon layer;
    a second silicon layer formed on the insulator layer;
    a gate region, a source region, and a drain region formed in the second silicon layer;
    a first partial trench formed in the second silicon layer between at least a portion of the gate region and at least a portion of the source region, wherein the first partial trench stops short of the insulator layer; and
    a second partial trench formed in the second silicon layer between at least a portion of the gate region and at least a portion of the drain region, wherein the second partial trench stops short of the insulator layer;
    wherein the gate region comprises a gate silicide region, the source region comprises a source silicide region, and the drain region comprises a drain silicide region;
    wherein the first partial trench is formed between the gate silicide region and the source silicide region and extends into the second silicon layer past the gate silicide region; and
    wherein the second partial trench is formed between the gate silicide region and the drain silicide region and extends into the second silicon layer past the gate silicide region.

2. The MESFET of claim 1, wherein gate region comprises a Schottky gate.

3. The MESFET of claim 1, further comprising:
    a first insulating spacer formed in the first partial trench; and
    a second insulating spacer formed in the second partial trench.

4. The MESFET of claim 1, further comprising:
    a first insulating spacer formed out of silicon dioxide ($SiO_2$) formed in the first partial trench, wherein the first insulating spacer is planarized; and
    a second insulating spacer formed out of silicon dioxide ($SiO_2$) formed in the second partial trench, wherein the second insulating spacer is planarized.

5. The MESFET of claim 1, wherein the first silicon layer comprises the bulk silicon layer of a silicon on insulator (SOI) substrate, the insulator layer comprises a buried oxide layer of the SOI substrate, and the second silicon layer comprises a device silicon layer of the SOI substrate.

6. The MESFET of claim 1, wherein the source region and the drain region of the second silicon layer comprise one of heavily N-type doped regions and heavily P-type doped regions.

* * * * *